United States Patent
Shih et al.

(10) Patent No.: US 8,969,202 B2
(45) Date of Patent: Mar. 3, 2015

(54) METHOD OF MANUFACTURING METAL SILICIDE AND SEMICONDUCTOR STRUCTURE USING THE SAME

(71) Applicant: Macronix International Co., Ltd., Hsinchu (TW)

(72) Inventors: Yen-Hao Shih, New Taipei (TW); Ying-Tso Chen, Kaoshsiung (TW); Shih-Chang Tsai, Hsinchu County (TW); Chun-Fu Chen, Taipei (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 14/174,931

(22) Filed: Feb. 7, 2014

(65) Prior Publication Data
US 2014/0154881 A1  Jun. 5, 2014

Related U.S. Application Data

(62) Division of application No. 13/413,951, filed on Mar. 7, 2012, now Pat. No. 8,674,410.

(51) Int. Cl.
*H01L 21/44* (2006.01)
*H01L 21/8234* (2006.01)
(Continued)

(52) U.S. Cl.
CPC ...... *H01L 21/283* (2013.01); *H01L 21/823443* (2013.01); *H01L 27/1052* (2013.01); *H01L 21/28052* (2013.01); *H01L 21/28123* (2013.01); *H01L 29/4933* (2013.01)
USPC ............ 438/682; 438/275; 438/692; 257/202

(58) Field of Classification Search
CPC ................ H01L 21/283; H01L 21/823443; H01L 21/28052; H01L 21/28123; H01L 27/1052; H01L 29/4933

USPC ................... 438/275, 689–693, 682; 257/202
See application file for complete search history.

(56) References Cited

U.S. PATENT DOCUMENTS 5,740,099 A  4/1998  Tanigawa
5,828,120 A  10/1998  Ishikawa
(Continued)

FOREIGN PATENT DOCUMENTS

JP  2172253 A  7/1990
TW  424303 B  3/2001

OTHER PUBLICATIONS

TW Office Action dated Mar. 11, 2014.
(Continued)

*Primary Examiner* — Mary Wilczewski
*Assistant Examiner* — Erik T Peterson
(74) *Attorney, Agent, or Firm* — McClure, Qualey & Rodack, LLP

(57) ABSTRACT

A method of manufacturing a metal silicide is disclosed below. A substrate having a first region and a second region is provided. A silicon layer is formed on the substrate. A planarization process is performed to make the silicon layer having a planar surface. A part of the silicon layer is removed to form a plurality of first gates on the first region and to form a plurality of second gates on the second region. The height of the first gates is greater than the height of the second gates, and top surfaces of the first gates and the second gates have the same height level. A dielectric layer covering the first gates and the second gates is formed and exposes the top surfaces of the first gates and the second gates. A metal silicide is formed on the top surfaces of the first gates and the second gates.

10 Claims, 4 Drawing Sheets

(51) Int. Cl.
*H01L 21/302* (2006.01)
*H01L 21/461* (2006.01)
*H01L 21/283* (2006.01)
*H01L 27/105* (2006.01)
*H01L 21/28* (2006.01)
*H01L 29/49* (2006.01)
*H01L 27/118* (2006.01)

(56) References Cited

U.S. PATENT DOCUMENTS

| | | |
|---|---|---|
| 6,468,867 B1 | 10/2002 | Lai et al. |
| 6,541,357 B1 | 4/2003 | Inaba |
| 6,835,662 B1 | 12/2004 | Erhardt et al. |
| 8,043,914 B2 | 10/2011 | Choi et al. |
| 2004/0056319 A1 | 3/2004 | Kuo et al. |
| 2007/0187764 A1* | 8/2007 | Furukawa et al. ............ 257/360 |
| 2010/0167490 A1 | 7/2010 | Choi et al. |

OTHER PUBLICATIONS

English Abstract translation of TW424303 (Published Mar. 1, 2001).
TW Office Action dated Aug. 21, 2014.
English Abstract translation of JP172253 (Published Jul. 3, 1990).

* cited by examiner

METHOD OF MANUFACTURING METAL SILICIDE AND SEMICONDUCTOR STRUCTURE USING THE SAME

This application is a divisional application of co-pending U.S. patent application Ser. No. 13/413,951, now U.S. Pat. No. 8,674,410, filed Mar. 7, 2012, the content of which is incorporated herein by reference.

BACKGROUND OF THE INVENTION

1. Field of the Invention

The invention relates in general to a semiconductor process and structure, and more particularly to a method of manufacturing a metal silicide and a semiconductor structure using the same.

2. Description of the Related Art

As the integration of semiconductor device increases, the pattern and the line width in the device gradually decrease. The contact resistance of the gate and the conductive line in the device thereby increases, leading to a higher RC delay and adversely affecting the operating speed. Since the resistance of metal silicide is lower than poly silicon and the thermal stability of metal silicide is higher than a typical interconnection material, forming metal silicide on a gate can lower the resistance between the gate and the metal interconnection.

During the conventional method of forming metal silicide, after a gate, for example a poly silicon layer, is formed on a semiconductor wafer, the silicidation process of the gate includes forming a metal layer on the poly silicon layer, and then performing an annealing process to form a metal silicide on the gate. The formation of the metal silicide is also carried out for the gate on the periphery circuit region to lower the resistance between the gate and the wirings. However, the formation of the self-align metal silicide (salicide) in the conventional process on part of material is complicated, especially when the height of the levels on the cell array area and the periphery circuit area are different, leading to the degree of difficulty increasingly. In the current age of high performance requirement, the efficiency of the semiconductor process must be improved better than that of the conventional process.

SUMMARY OF THE INVENTION

The invention is directed to a method of manufacturing a metal salicide and a semiconductor structure using the same. The gates formed on the cell array region and the periphery circuit region have the same height level to prevent the metal silicide incapable of forming on the gates since the gates on the lower region are covered by the dielectric layer.

According to a first aspect of the present invention, a method of manufacturing a metal silicide is disclosed. The method includes the following steps. A substrate is provided. The substrate has a first region and a second region. A silicon layer is formed on the substrate. A planarization process is performed to make the silicon layer having a planar surface. A part of the silicon layer is removed to form a plurality of first gates on the first region and to form a plurality of second gates on the second region. The height of the first gates is greater than the height of the second gates, and top surfaces of the first gates and the second gates have the same height level. A dielectric layer is formed on the substrate. The dielectric layer covers the first gates and the second gates and exposes the top surfaces of the first gates and the second gates. A metal silicide is formed on the top surfaces of the first gates and the second gates.

According to a second aspect of the present invention, a semiconductor structure is disclosed. The semiconductor structure includes a substrate, a silicon layer, a dielectric layer and a metal silicide. The substrate has a first region and a second region. The silicon layer has a plurality of first gates on the first region and a plurality of second gates on the second region, the height of the first gates is greater than that of the second gates, and top surfaces of the first gates and the second gates have the same height level. The dielectric layer is formed on the substrate and the dielectric layer exposes the top surfaces of the first gates and the second gates. The metal silicide is formed on the top surfaces of the first gates and the second gates.

The above and other aspects of the invention will become better understood with regard to the following detailed description of the preferred but non-limiting embodiment(s). The following description is made with reference to the accompanying drawings.

DETAILED DESCRIPTION OF THE INVENTION

Figure 1A:
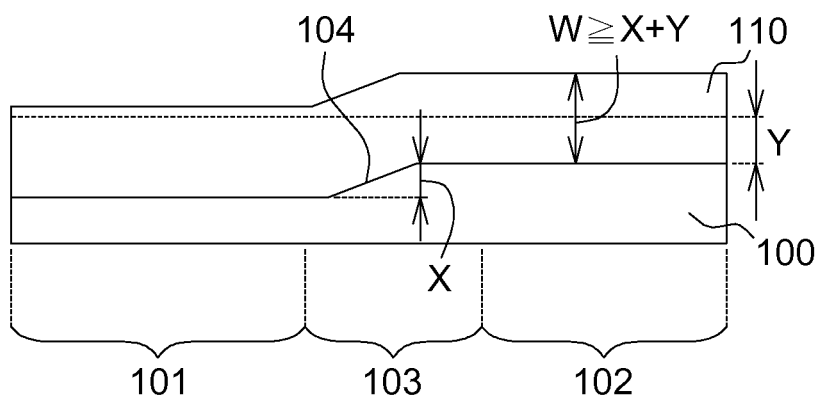
FIGS. 1A-1F show a method of manufacturing a metal salicide and a semiconductor structure using the same according to an embodiment of the present invention.

A method of manufacturing a metal salicide and a semiconductor structure using the same of the present invention are provided by thickening a silicon layer deposited on a substrate and then thinning the silicon layer by planarization process so that the silicon layer has a planar surface of the same height level. After patterning the silicon layer, a first gate and a second gate of the same height level are formed accordingly. Thus, the metal silicide, in the following thermal process, can be successfully formed on the gates on the cell array region and the periphery circuit region to lower the sheet resistance of the gates.

A number of embodiments are disclosed below for detailed descriptions of the invention only, not for limiting the scope of protection of the invention.

First Embodiment

Referring to FIGS. 1A-1F, a method of manufacturing a metal salicide and a semiconductor structure using the same according to an embodiment of the present invention are shown. The method at least includes the following steps. A substrate 100 is provided. The substrate 100 has a first region 101 and a second region 102. A silicon layer 110 is formed on the substrate 100. A planarization process is performed to make the silicon layer 110 having a planar surface 111. A part of the silicon layer 110 is removed to form a plurality of first gates 121 on the first region 101 and to form a plurality of second gates 122 on the second region 102. The height X+Y of the first gates 121 is greater than the height Y of the second gates 122, and top surfaces 120 of the first gates 121 and the second gates 122 have the same height level. A dielectric layer 130 is formed on the substrate 100. The dielectric layer 130 covers the first gates 121 and the second gates 122 and exposes the top surfaces 120 of the first gates 121 and the second gates 122. A metal silicide 140 is formed on the top surfaces 120 of the first gates 121 and the second gates 122.

As shown in FIG. 1A, the substrate 100 has a first region 101 and a second region 102. The silicon layer 110 is formed on the substrate 100 and has the same thickness on the first region 101 and the second region 102. The first region 101 and the second region 102 of the substrate 100 have different heights with respect to the bottom of the substrate 100, so that there is a significant difference X in height between the first region 101 and the second region 102. Moreover, the substrate 100 has an oblique surface 104 located on a local interconnection region 103, for example, so that the local interconnection region 103 is inclined between the first region 101 and the second region 102.

In the present embodiment, the substrate 100 is a semiconductor base containing rich silicon. The silicon layer 110 is such as a poly silicon layer formed by chemical vapor deposition method. The silicon layer 110 has a height W greater than (or equal to) a predetermined deposit height X+Y, wherein X denotes the difference in height between the first region 101 and the second region 102, and Y denotes an ideal height of the second gates 122. The first region 101 is a cell array region and the second region 102 is a periphery circuit region, for example. In another embodiment, the first region 101 is a periphery circuit region and the second region 102 is a cell array region, for example. In the cell array region, the active elements (such as memory cell) are used to store data. In the periphery circuit region, the logic units (such as transistor switch) are used to read and calculate the data stored in the memory cell. In the following process, the silicon layer 110 after planarization process and patterning process can be used as the gate of the memory cell and the gate of the logic unit, respectively.

Figure 1B:
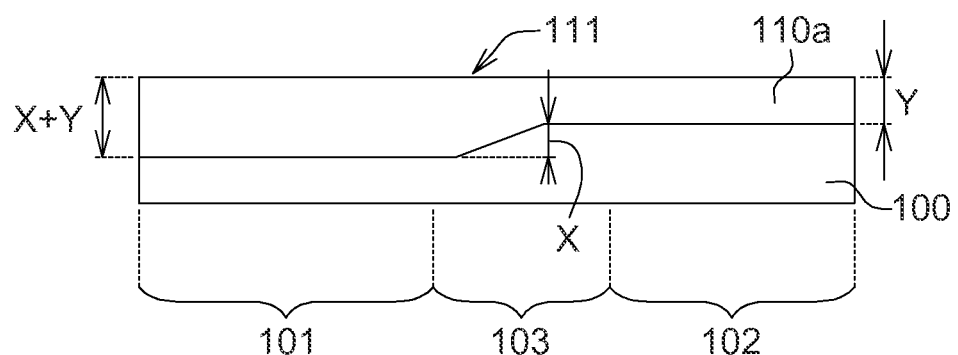
Figure 1C:
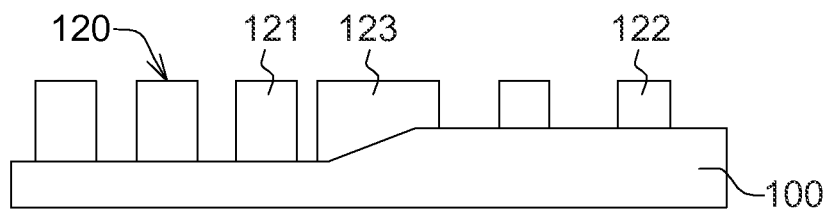

Referring to FIG. 1B, the planarization process such as chemical mechanical polishing (CMP) process is performed to form the planar surface 111 of the silicon layer 110. In the same time, the thinned silicon layer 110a has a height X+Y with respect to the first region 101 and has a height Y with respect to the second region 102. Then referring to FIG. 1O, a part of the silicon layer 110a is removed by lithography and anisotropic etching processes, for example, to form a plurality of first gates 121 on the first region 101 and a plurality of second gates 122 on the second region 102. The height of the first gates 121 is X+Y, and the height of the second gates 122 is Y, so that the height of the first gates 121 is greater than that of the second gates 122 and the top surfaces 120 of the first gates 121 and the second gates 122 have the same height level. The process shown in the FIG. 1O further includes forming a third gate 123 on the local interconnection region 103, and the top surfaces 120 of the first gates 121, the second gates 122 and the third gate 123 have the same height level. In the present embodiment, the first gates 121, the second gates 122 and the third gate 123 are the gates of transistors (such as N-type metal-Oxide semiconductor transistor, NMOS transistor) having the same polarity, or the gates of PMOS (P-type metal-Oxide semiconductor) transistor having inversely polarity with respect to that of the NMOS transistor. In one embodiment, a local interconnection line can be substituted for the third gate 123 between the first gate 121 and the second gate 122, and not limited to a gate of the transistor.

Figure 1D:
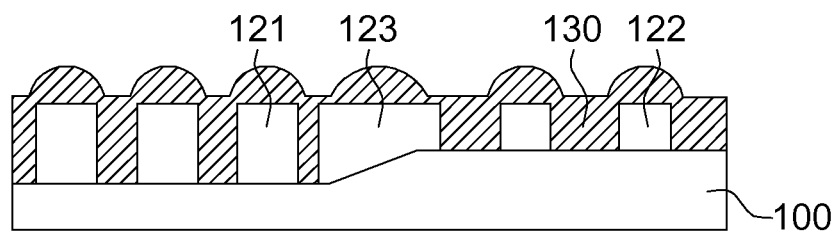
Figure 1E:
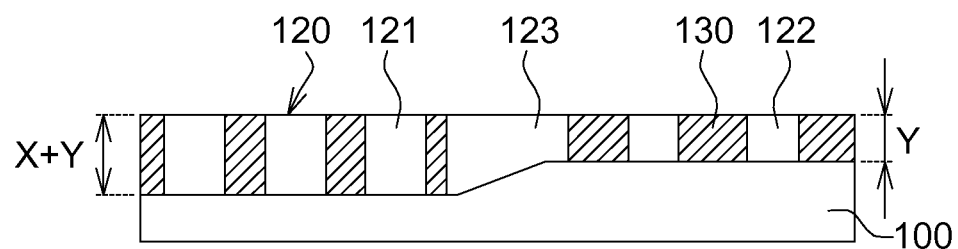

Referring to FIGS. 1D and 1E, a dielectric layer 130 is formed on the substrate 100, so that the dielectric layer 130 can fill into the gap between two neighboring gates and covers the top surfaces 120 of the first gates 121, the second gates 122 and the third gate 123. As shown in FIG. 1E, the dielectric layer 130 is thinned by a planarization process such as chemical mechanical polishing process, so that the dielectric layer 130 and the gates have the same height level, and the top surfaces 120 of the first gates 121, the second gates 122 and the third gate 123 are exposed.

Figure 1F:
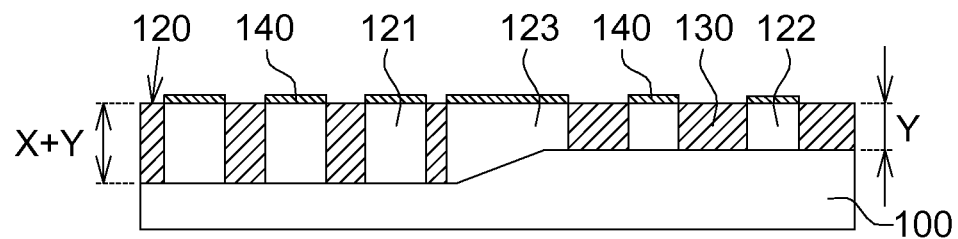

Further, referring to the FIG. 1F, a metal silicide 140 is separately formed on the top surfaces 120 of the first gates 121, the second gates 122 and the third gate 123. During the thermal process, the metal layer and the thinned silicon layer 110a adjacent to the metal layer are heated to the high temperature, for example 960° C., and the metal grains and the silicon grains are rearranged to form a metal silicide 140. The processes of forming the self-aligned metal silicide 140 (metal salicide) in FIG. 1F are as follows. First, a metal layer (not shown) is formed on the thinned silicon layer 110a and the dielectric layer 130 by the chemical vapor deposition or by the physical vapor deposition process. A thermal process is conducted, such as annealing process, so that the metal layer reacts with the thinned silicon layer 110a to form a metal silicide 140. Thereafter, the remaining metal layer, which does not react with the silicon layer 110, is removed. The material of the metal silicide 140, for example, includes tungsten silicide, molybdenum silicide, cobalt silicide, titanium silicide, nickel silicide, and other refractory metal silicide. Thus, the sheet resistance of the first gates 121, the second gates 122 and the third gate 123 are reduced.

Second Embodiment

Referring to FIGS. 2A-2F, a method of manufacturing a metal salicide and a semiconductor structure using the same according to an embodiment of the present invention are shown. The difference between the method of the present embodiment and the first embodiment lies in that the step of forming the silicon layer 210 in the FIG. 2A and the step of planarization of the silicon layer 210 in the FIG. 2B. As for the processes of patterning silicon layer 210, forming the dielectric layer 230, planarization of the dielectric layer 230 and forming the metal silicide 240, shown in the FIGS. 2C-2F respectively, are similar to the processes of the first embodiment mentioned above, the similarities are not repeated therein.

Figure 2A:
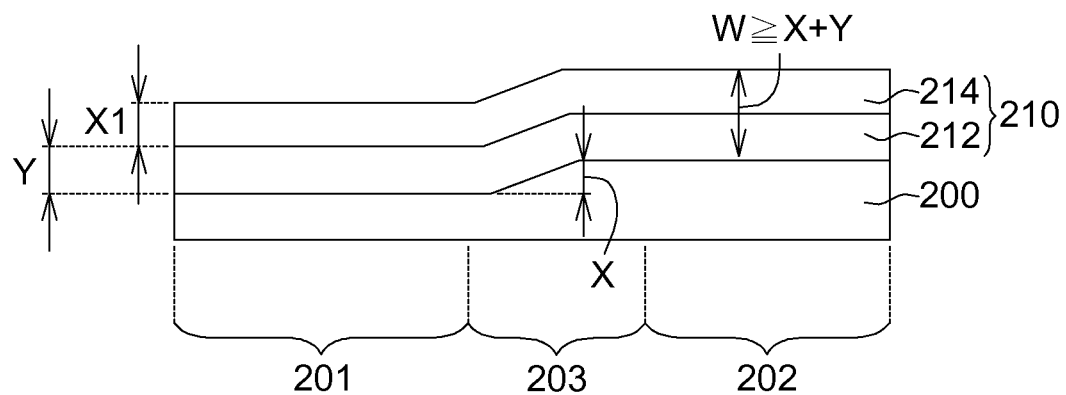
FIGS. 2A-2F show a method of manufacturing a metal salicide and a semiconductor structure using the same according to an embodiment of the present invention.

Referring to FIG. 2A, the silicon layer 210 includes a poly silicon layer 212 of a first height Y and an amorphous silicon layer 214 of a second height X1, which are formed by chemical vapor deposition method. The second height X1 is greater than (or equal to) the difference X in height between the first region 201 and the second region 202, and the first height Y is an ideal height of the second gates 222. Thus, the silicon layer 210 has a total height W greater than the predetermined deposition height X+Y.

Figure 2B:
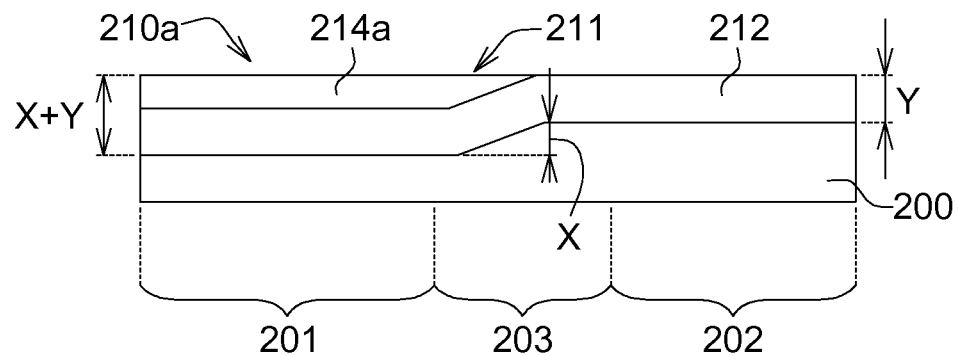
Figure 2C:
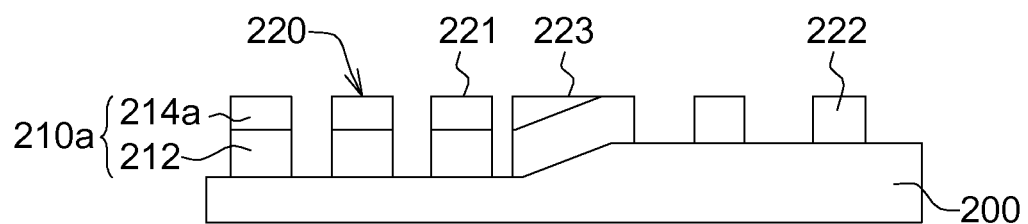
Figure 2D:
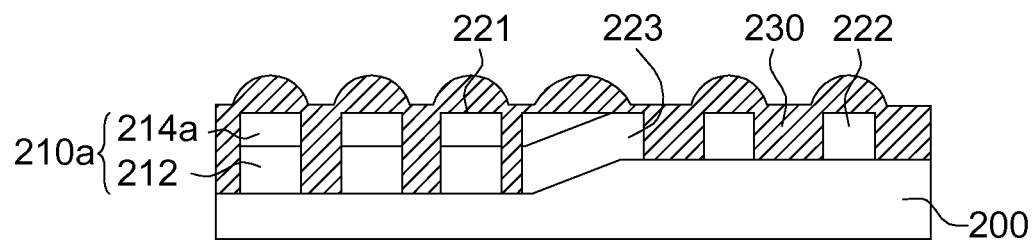
Figure 2E:
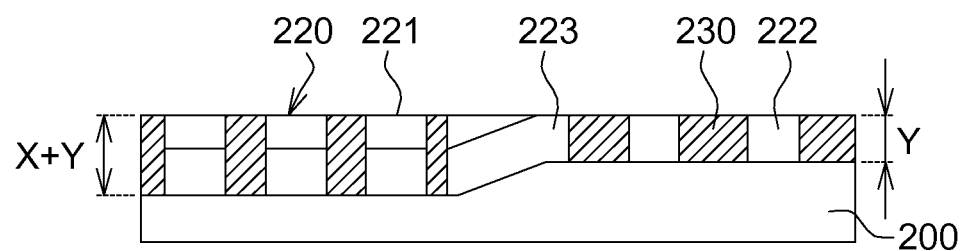
Figure 2F:
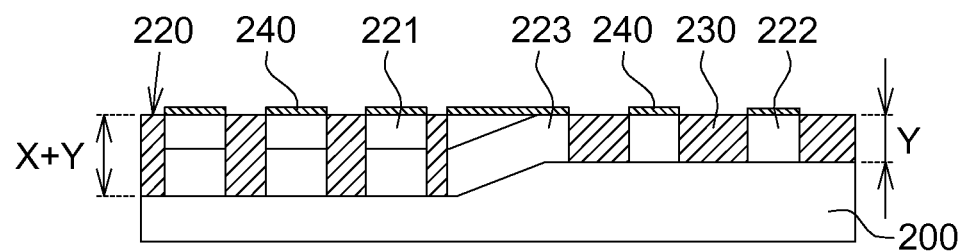

Referring to the FIG. 2B, the planarization process such as chemical mechanical polishing (CMP) process is performed to form a planar surface 211 of the silicon layer 210. In the same time, the thinned silicon layer 210a has a height X+Y with respect to the first region 201 and has a height Y with respect to the second region 202. In the present embodiment, the amorphous silicon layer 214 on the second region 202 is removed to expose the poly silicon layer 212 underneath the amorphous silicon layer 214, so that the amorphous silicon layer 214a, which is not removed in FIG. 2B, aligns with the poly silicon layer 212, and both of the amorphous silicon layer 214a and the poly silicon layer 212 have a planar surface 211 at the same height level. Since the poly silicon layer 212 underneath the amorphous silicon layer 214 can be used for a stop layer to etch or chemical mechanical polish the silicon layer 210, the etching depth of the silicon layer 210 can be precisely controlled.

In the following FIG. 2B, the amorphous silicon layer 214 can be heated, such as at the temperature about 600° C., to recrystallize and be transformed into another poly silicon layer before the step of forming the metal silicide 240. Since the poly silicon layer 212 has better electron mobility than the amorphous silicon layer 214, the switch ability of the memory cell and the driving ability of the logic unit will be advanced.

In the present embodiment, after the silicon layer 210a is patterned (FIG. 2C), the top surfaces 220 of the first gates 221, the second gates 222 and the third gate 223 have the same height level. Therefore, the metal silicide 240, during the following thermal process, can be successfully formed on the gates on the first region 201 (such as the cell array region), the second region 202 (such as the periphery circuit region) and the local interconnection region 203 to lower the sheet resistance of the gates.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of manufacturing a semiconductor device, comprising:
    providing a substrate, wherein the substrate has a first region and a second region;
    forming a silicon layer on the substrate;
    performing a planarization process to make the silicon layer having a planar surface;
    removing a part of the silicon layer to form a plurality of first gates on the first region and to form a plurality of second gates on the second region, wherein the height of the first gates is greater than that of the second gates, and top surfaces of the first gates and the second gates have the same height level;
    forming a dielectric layer on the substrate, wherein the dielectric layer is fully filled between one of the first gates and one of the second gates and exposes the top surfaces of the first gates and the second gates; and
    forming a metal silicide on the top surfaces of the first gates and the second gates.

2. The method according to claim 1, wherein the first region is a cell array region, and the second region is a periphery circuit region.

3. The method according to claim 1, wherein the first region is a periphery circuit region, and the second region is a cell array region.

4. The method according to claim 1, wherein the substrate has an oblique surface on a local interconnection region between the first region and the second region.

5. The method according to claim 1, wherein the first region has a difference in height with respect to the second region.

6. The method according to claim 1, wherein a surface of the substrate located in the first region is lower than that located in the second region.

7. The method according to claim 1, wherein the steps of forming the silicon layer and performing the planarization process include:
    forming a poly silicon layer on the substrate;
    forming an amorphous silicon layer on the poly silicon layer; and
    planarizing the amorphous silicon layer, so that the amorphous silicon layer aligns with the poly silicon layer and both of the amorphous silicon layer and the poly silicon layer have a planar surface.

8. The method according to claim 7, wherein after planarizing the amorphous silicon layer, the method further comprises heating the amorphous silicon layer to a recrystallization temperature and transforming the amorphous silicon layer into another poly silicon layer.

9. The method according to claim 1, wherein after forming the dielectric layer, the method further comprises planarizing the dielectric layer.

10. The method according to claim 1, wherein the step of forming the metal silicide comprises:
    forming a metal layer on the silicon layer and the dielectric layer;
    conducting a thermal process, so that the metal layer reacts with the silicon layer to form the metal silicide; and
    removing the remaining metal layer which is not reacted with the silicon layer.

* * * * *